(12) United States Patent
Yandoc et al.

(10) Patent No.: US 12,159,818 B2
(45) Date of Patent: Dec. 3, 2024

(54) MULTI-CHIP PACKAGED SEMICONDUCTOR DEVICE

(71) Applicant: NEXPERIA B.V., Nijmegen (NL)

(72) Inventors: Ricardo Yandoc, Nijmegen (NL); Adam Brown, Nijmegen (NL); Phil Rutter, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 197 days.

(21) Appl. No.: 17/579,014

(22) Filed: Jan. 19, 2022

(65) Prior Publication Data
US 2022/0230942 A1 Jul. 21, 2022

(30) Foreign Application Priority Data

Jan. 20, 2021 (EP) ..................................... 21152469

(51) Int. Cl.
*H01L 23/495* (2006.01)
*H01L 23/00* (2006.01)
(Continued)

(52) U.S. Cl.
CPC .... *H01L 23/49575* (2013.01); *H01L 23/3107* (2013.01); *H01L 23/34* (2013.01);
(Continued)

(58) Field of Classification Search
CPC ... H01L 2924/181; H01L 24/41; H01L 24/84; H01L 24/32; H01L 24/83;
(Continued)

(56) References Cited

U.S. PATENT DOCUMENTS 7,271,477 B2 * 9/2007 Saito ................. H01L 23/49575
257/E23.052
8,933,518 B2 * 1/2015 Xue ...................... H01L 27/088
438/286
(Continued)

FOREIGN PATENT DOCUMENTS

EP 2259313 A1 12/2010
JP 2002208673 A 7/2002

OTHER PUBLICATIONS

Extended European Search Report and Written Opinion for corresponding European application EP 21152469.9, 10 pages, dated Jul. 12, 2021.

*Primary Examiner* — Alonzo Chambliss
(74) *Attorney, Agent, or Firm* — Ruggiero McAllister & McMahon LLC

(57) ABSTRACT

A packaged semiconductor device is provided, including a first semiconductor die on which a first electrical component is integrated that includes a first terminal at a first surface of the first die and a second terminal at a second surface of the first die, a second semiconductor die similar to the first die, with a first surface of the second die facing the first surface of the first die. A first conductive element on the second surface of the first side electrically connected to the second terminal of the first electrical component, a second conductive element is on the second surface of the second die electrically connected to the second terminal of the second electrical component, and a third conductive element between the first surfaces of the first and the second die. The first terminals of the first and second electrical components are electrically connected through the third conductive element.

18 Claims, 5 Drawing Sheets

(51) Int. Cl.
  *H01L 23/31* (2006.01)
  *H01L 23/34* (2006.01)
  *H01L 23/498* (2006.01)

(52) U.S. Cl.
  CPC .. *H01L 23/49503* (2013.01); *H01L 23/49562* (2013.01); *H01L 23/49838* (2013.01); *H01L 24/32* (2013.01); *H01L 24/41* (2013.01); *H01L 24/83* (2013.01); *H01L 24/84* (2013.01); *H01L 2924/181* (2013.01)

(58) Field of Classification Search
  CPC ........... H01L 23/49575; H01L 23/3107; H01L 23/34; H01L 23/49503; H01L 23/49562; H01L 23/49838
  See application file for complete search history.

(56) References Cited

U.S. PATENT DOCUMENTS

| | | | |
|---|---|---|---|
| 9,496,208 B1* | 11/2016 | Ostrowicki | H01L 23/49562 |
| 9,589,929 B2* | 3/2017 | Terrill | H01L 21/4853 |
| 9,812,384 B2* | 11/2017 | Ostrowicki | H01L 23/49541 |
| 11,189,612 B2* | 11/2021 | Suganuma | H01L 27/0788 |
| 2001/0052641 A1* | 12/2001 | Kuo | H01L 23/49562 |
| | | | 257/E25.018 |
| 2009/0212405 A1 | 8/2009 | Liu et al. | |
| 2011/0227207 A1 | 9/2011 | Yilmaz et al. | |
| 2014/0054758 A1* | 2/2014 | Yilmaz | H01L 23/49524 |
| | | | 257/669 |
| 2014/0061884 A1* | 3/2014 | Carpenter | H01L 24/73 |
| | | | 257/676 |

* cited by examiner

MULTI-CHIP PACKAGED SEMICONDUCTOR DEVICE

CROSS REFERENCE TO RELATED APPLICATION

This application claims the benefit under 35 U.S.C. § 119(a) of European Application No. 21152469.9 filed Jan. 20, 2021, the contents of which are incorporated by reference herein in their entirety.

BACKGROUND OF THE DISCLOSURE

1. Field of the Disclosure

The present disclosure relates to a packaged semiconductor device. The present disclosure is particularly useful for power products and power applications.

2. Description of the Related Art

Packaged semiconductor devices typically comprise a die pad on which a semiconductor die is mounted, which structure is encapsulated by a package material to protect the semiconductor die. Connections in the form of leads are typically provided on the outside of the package to be able to contact one or more terminals of the electrical component(s) that is or are integrated on the semiconductor die. For example, a metal-oxide-semiconductor field-effect transistor (MOSFET) or a bipolar junction transistor (BJT) may be formed in the semiconductor die, and the leads may provide an external connection terminal for the gate, source and drain terminal of the MOSFET or BJT. This may similarly apply to other types of semiconductors which have a different number of terminals such as, for example, a diode.

Most semiconductor devices can be partly characterized by an on-resistance. For example, for a MOSFET, the on-resistance between the drain and source terminal is an important parameter for power applications. In general, the larger and thinner the size of the semiconductor die, the better on-resistance performance the device can have. However, quality issues such as die crack can be a big concern in manufacturing large die sizes. When aiming for very low on-resistance, constraints on maximum die size that can be manufactured inside assembly centres must be taken into consideration. Consequently, simply increasing the die size may not be a feasible solution.

One alternative option to achieve a better on-resistance performance is to use two separate packaged semiconductor devices, and connect their respective terminals in parallel externally. As an effective area of the device is doubled, the on-resistance performance is approximately halved. However, a drawback of this approach is that the packaged devices can be subject to thermal imbalance. For example, one of the packaged devices may become hotter than the other packaged device, thereby resulting in an imbalance in current accommodation between the devices, among other performance imbalances. Due to the larger current accommodation, power dissipation may increase, resulting in an even higher temperature of the packaged device, thereby causing a further thermal imbalance. A thermal imbalance is thus detrimental to the performance of the overall device.

SUMMARY

It is an object of the present disclosure to provide a device for which the abovementioned problems do not occur, or hardly so.

This object is achieved with the packaged semiconductor device which comprises a first semiconductor die on which a first electrical component is integrated that comprises a first terminal arranged at a first surface of the first semiconductor die and a second terminal arranged at a second surface of the first semiconductor die, a second semiconductor die on which a second electrical component is integrated that comprises a first terminal arranged at a first surface of the second semiconductor die and a second terminal arranged at a second surface of the second semiconductor die, wherein the first surface of the second semiconductor die is arranged such that it faces the first surface of the first semiconductor die, a first conductive element arranged on the second surface of the first semiconductor die and being electrically connected to the second terminal of the first electrical component, a second conductive element arranged on the second surface of the second semiconductor die and being electrically connected to the second terminal of the second electrical component, a third conductive element arranged in between the first surfaces of the first semiconductor die and the second semiconductor die, wherein the first terminals of the first and second electrical components are electrically connected through said third conductive element, and a solidified moulding compound encapsulating the first semiconductor die and the second semiconductor die. Furthermore, the second conductive element comprises one or more second leads that extend through and out of the solidified moulding compound to provide external electrical access to the second conductive element and/or the third conductive element comprises one or more third leads that extend through and out of the solidified moulding compound to provide external electrical access to the third conductive element, the third conductive element being configured to provide a common first terminal for the first and second electrical components.

Since the first semiconductor die and the second semiconductor die are arranged in a single package, a thermal imbalance between said dies is mitigated. In particular, an improved on-resistance performance can be achieved without using a larger single die, and without connecting a multitude of packaged semiconductor devices in parallel.

The first conductive element may comprise a die pad and/or the first conductive element can be partially encapsulated by the solidified moulding compound.

In some embodiments, both the second conductive element and the third conductive element comprise leads.

The first and second electrical components may each comprise a third terminal arranged at the second surface of the first semiconductor die and the second surface of the second semiconductor die, respectively. Furthermore, the packaged semiconductor device may further comprise a fourth conductive element electrically connected to the third terminal of the first electrical component, and a fifth conductive element electrically connected to the third terminal of the second electrical component. The fourth conductive element may comprise one or more fourth leads that extend through and out of the solidified moulding compound to provide external electrical access to the fourth conductive element, and the fifth conductive element may comprise one or more fifth leads that extend through and out of the solidified moulding compound to provide external electrical access to the fifth conductive element.

In some embodiments, the first and second electrical components may be field-effect transistors, such as metal-oxide-semiconductor field-effect transistors, MOSFETs. In that case, the first terminal may correspond to a drain terminal, the second terminal to a source terminal, and the third terminal to a gate terminal. Alternatively, the first and second electrical components may be bipolar junction transistors, BJTs. In that case, the first terminal may correspond to a collector terminal, the second terminal to an emitter terminal, and the third terminal to a base terminal. A combination of different technologies or transistor structures for the first and second electrical components is also possible.

The second conductive element may be electrically connected to the first conductive element, thereby providing a common second terminal for the first and second electrical components. Additionally, or alternatively, the fourth conductive element may be electrically connected to the fifth conductive element, thereby providing a common third terminal for the first and second electrical components. Additionally, or alternatively, the second conductive element and the fifth conductive element extend parallel to each other. For example, the second conductive element and the fifth conductive element may have formed different parts of a same clip comprised by lead frame, and the first conductive element and the fourth conductive element may have formed different parts of a same clip comprised by lead frame.

The first and second electrical components may each comprise a third terminal arranged at the first surface of the first semiconductor die and the first surface of the second semiconductor die, respectively. Furthermore, the packaged semiconductor device may further comprise a sixth conductive element arranged in between the first surfaces of the first semiconductor die and the second semiconductor die. The third terminals of the first and second electrical components may be electrically connected through said sixth conductive element and said sixth conductive element may be configured to provide a common third terminal for the first and second semiconductor dies. Furthermore, the sixth conductive element may comprise one or more sixth leads that extend through and out of the solidified moulding compound to provide external electrical access to the sixth conductive element. The third conductive element may comprise one or more of said third leads.

In some embodiments, the first and second electrical components may be field-effect transistors, such as metal-oxide-semiconductor field-effect transistors, MOSFETs. In that case, the first terminal may correspond to a source terminal, the second terminal to a drain terminal, and the third terminal to a gate terminal. Alternatively, the first and second electrical components may be bipolar junction transistors. In that case, the first terminal may correspond to an emitter terminal, the second terminal to a collector terminal, and the third terminal to a base terminal. Again, a combination of the technologies for the first and second electrical components is also possible.

The second conductive element may be electrically connected to the first conductive element, thereby providing a common second terminal for the first and second semiconductor dies. Additionally, or alternatively, the first conductive element may comprise a die-pad. Additionally, or alternatively, the first conductive element is at least partially exposed to an outside for allowing electrical connection to the first conductive element. The second conductive element may at least be partially exposed to an outside for allowing a heat sink or heat spreader to be connected to the second conductive element. For example, the packaged semiconductor device of the present disclosure can be arranged on a printed circuit board. A thermal paste can be provided on the exposed part of the second conductive element after which a heat sink or heat spreader can be mounted. Additionally, or alternatively, the sixth conductive element and the third conductive element extend parallel to each other. For example, the sixth conductive element and the third conductive element formed different parts of a same clip comprised by lead frame.

The first semiconductor die and the second semiconductor die may be substantially identical. Additionally, or alternatively, the packaged semiconductor device may further comprise a conductive layer arranged in between each conductive element and the terminal(s) it is connected to, wherein each conductive layer preferably comprises one of copper, aluminium, silver, gold and tin.

Each of the first and second conductive element, and when applicable, each of the third to sixth conductive elements may comprise a central planar part that is connected to the corresponding terminal and from which the one or more leads extend.

In some embodiments, the first or second conductive element may comprise a bent edge part integrally connected to the central part, the bent edge part being electrically connected to the central part of the second or first conductive element, respectively. Additionally, or alternatively, the fourth or fifth conductive element may comprise a bent edge part integrally connected to the central part, the bent edge part being electrically connected to the central part of the fifth or fourth element, respectively.

The first or second conductive element may comprise a bent edge part integrally connected to the central part, the bent edge part being electrically connected to the central part of the second or first conductive element, respectively.

For at least one conductive element among the first to sixth conductive elements, the one or more leads may be gull-wing shaped.

BRIEF DESCRIPTION OF THE DRAWINGS

Next, the present disclosure will be described with reference to the appended drawings, wherein.

Hereinafter, reference will be made to the appended drawings. It should be noted that identical reference signs may be used to refer to identical or similar components.

DETAILED DESCRIPTION

Figure 1A:
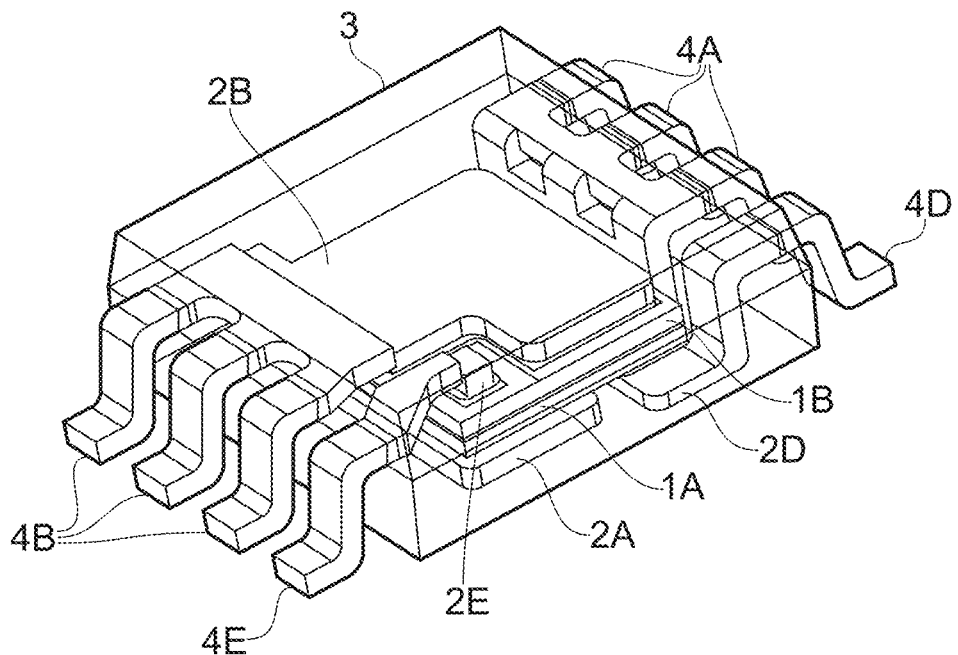
FIG. 1A is a perspective view of a packaged semiconductor device according to an embodiment of the present disclosure.
Figure 1B:
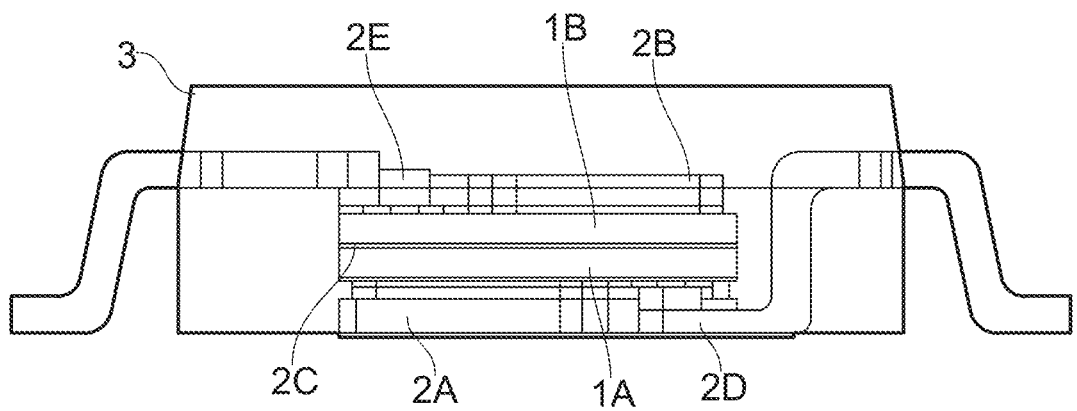
FIG. 1B is a cross-sectional view of the packaged semiconductor device shown in FIG. 1A.

FIGS. 1A and 1B illustrate a packaged semiconductor device 10 in accordance with an embodiment of the present disclosure. Packaged semiconductor device 10 comprises a solidified moulding compound 3 that encapsulates a first semiconductor die 1A and a semiconductor die 1B.

In the example shown in FIGS. 1A and 1B, the first electrical component that is arranged on the first semiconductor die and the second electrical component that is arranged on the second semiconductor die each comprise three terminals arranged at a respective first or second surface of the first or second semiconductor die, respectively. However, the present disclosure is not limited to three-terminal components, and other numbers of terminals are conceivable. For example, a diode, having two terminals, may similarly be implemented on the semiconductor dies.

First and second semiconductor dies 1A and 1B are stacked on top of each other such that a terminal of the first electrical component on first semiconductor die 1A faces a corresponding terminal of the second electrical component on second semiconductor die 1B. For example, if a MOSFET is implemented on the first and second semiconductor die, then, in accordance with the embodiment shown in FIGS. 1A and 1B, the first and second semiconductor die 1A and 1B may face each other such that a drain terminal of the first electrical component on first semiconductor die 1A faces a drain terminal of the second electrical component on second semiconductor die 1B. However, the present disclosure is not limited to first semiconductor die 1A and second semiconductor die 1B being identical or implementing identical technologies. For example, one semiconductor die may implement a MOSFET, while another semiconductor die implements a BJT. In that case, for example, the drain terminal of the MOSFET may be arranged to face the collector terminal of the BJT.

In other words, the first electrical component on first semiconductor die 1A may have a first terminal arranged at a first surface of first semiconductor die 1A, and a second terminal arranged at a second surface of first semiconductor die 1A. Second semiconductor die 1B may have a similar configuration. In that case, the first surfaces of first and second semiconductor dies 1A and 1B are arranged to face each other.

In accordance with the embodiment shown in FIGS. 1A and 1B, in order to connect the first terminals of the first and second electrical component on first and second semiconductor dies 1A and 1B, respectively, a conductive layer 5 may be provided in between the first surfaces of first semiconductor die 1A and second semiconductor die 1B. Conductive layer 5 may comprise a conductive material, such as aluminium, copper, silver, gold, or a soldering material such as tin.

Packaged semiconductor device 10 further comprises a first conductive element 2A that is electrically connected to a second terminal of the first electrical component on first semiconductor die 1A, and a second conductive element 2B that is electrically connected to a second terminal of the second electrical component on second semiconductor die 1B. First and second conductive elements 2A and 2B may be partially encapsulated by solidified moulding compound 3 and may comprise one or more respective leads 4A and 4B that extend through solidified moulding compound 3, and are configured to provide external connections to a respective terminal of the first or second electrical component on semiconductor die 1A or 1B, respectively. However, some conductive elements may not comprise leads. Instead, a portion of solidified moulding compound 3 may be omitted, thereby exposing a portion of one or more conductive elements, through which an external connection can be made. In the example shown in FIGS. 1A and 1B, each of first and second conductive element 2A and 2B comprises one or more respective leads 4A and 4B.

In the embodiment shown in FIGS. 1A and 1B, the first and second electrical component on semiconductor dies 1A and 1B each comprise a third terminal arranged at a second surface of semiconductor dies 1A and 1B, respectively. In other words, the first terminal of the first electrical component on first semiconductor die 1A is provided at a first surface of first semiconductor die 1A and the first terminal of the second electrical component on second semiconductor die 1B is provided at a first surface of second semiconductor die 1B, while the second and third terminals are provided at a second surface of the first and second semiconductor dies 1A, 1B. To this end, packaged semiconductor device 10 further comprises a fourth conductive element 2D that is electrically connected to the third terminal of the first electrical component on first semiconductor die 1A, and a fifth conductive element 2E that is electrically connected to the third terminal of the second electrical component on second semiconductor die 1B. Both fourth conductive element 2D as well as fifth conductive element 2E comprise respective leads 4D and 4E that extend through solidified moulding compound 3 for providing an external connection point to respective third terminals of the semiconductor dies 1A and 1B.

In the above description, reference is made to a first, second and third terminal of the first and second electrical component. In an example, the first and second electrical component may each be a MOSFET. In this case, the first terminal may correspond to a drain terminal, the second terminal may correspond to a source terminal, and the third terminal may correspond to a gate terminal. Alternatively, if the first and second electrical component are each a BJT, the first terminal may correspond to a collector terminal, the second terminal may correspond to an emitter terminal, and the third terminal may correspond to a base terminal. The structure shown in FIGS. 1A and 1B may be referred to as a common-drain or common-collector structure, since the drain or collector terminals of the first and second electrical component are connected internally to package 3.

Figure 2A:
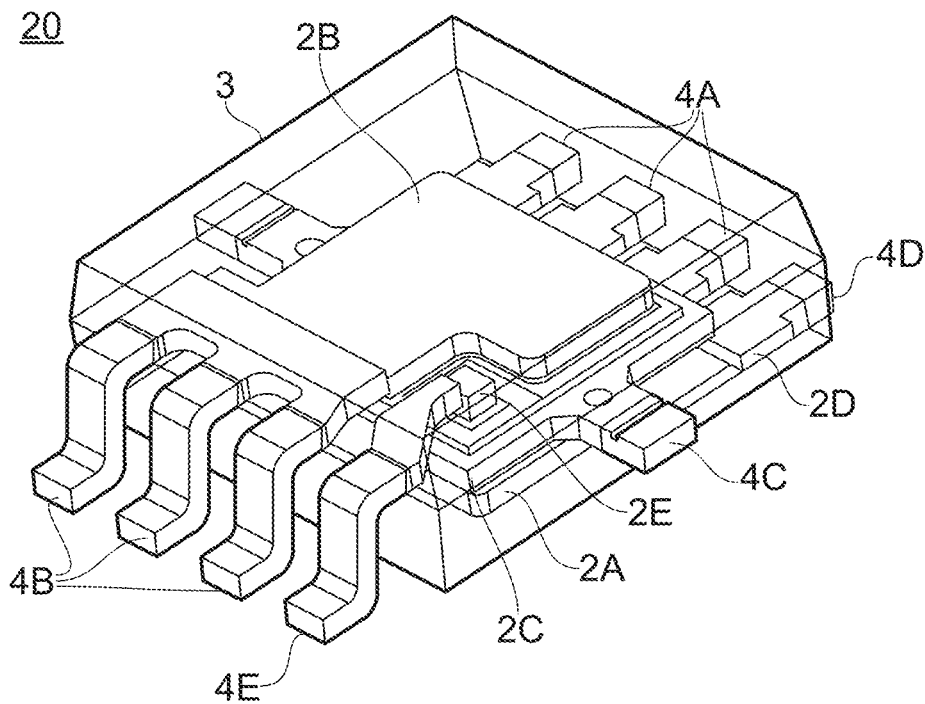
FIG. 2A is a perspective view of a packaged semiconductor device according to another embodiment of the present disclosure.
Figure 2B:
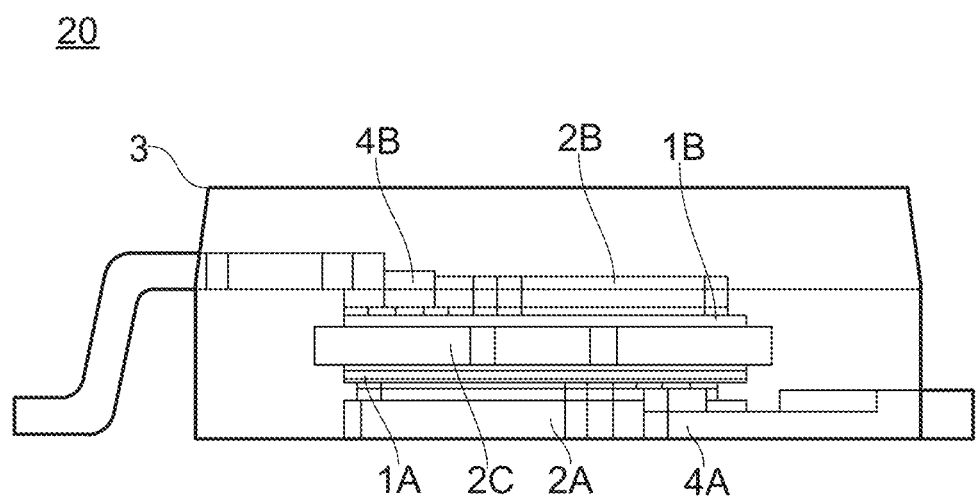
FIG. 2B is a cross-sectional view of the packaged semiconductor device shown in FIG. 2A.

FIGS. 2A and 2B show a packaged semiconductor device 20 in accordance with another embodiment of the present disclosure. Packaged semiconductor device 20 differs from packaged semiconductor device 10 in that a third conductive element 2C is provided in between first and second semiconductor dies 1A and 1B electrically connecting the first terminal of the first electrical component and the first terminal of the second electrical component on first and second semiconductor dies 1A and 1B, respectively. In accordance with the embodiment shown in FIGS. 2A and 2B, third conductive element 2C comprises leads 4C that extend through solidified moulding compound 3 for providing an external connection to the first terminal of the first and second electrical component on first and second semiconductor dies 1A and 1B, respectively. More particularly, leads 4C provide a common connection point to the first terminals of the first and second electrical component. The structure shown in FIGS. 2A and 2B may similarly be referred to as a common-drain or common-collector structure.

Figure 3A:
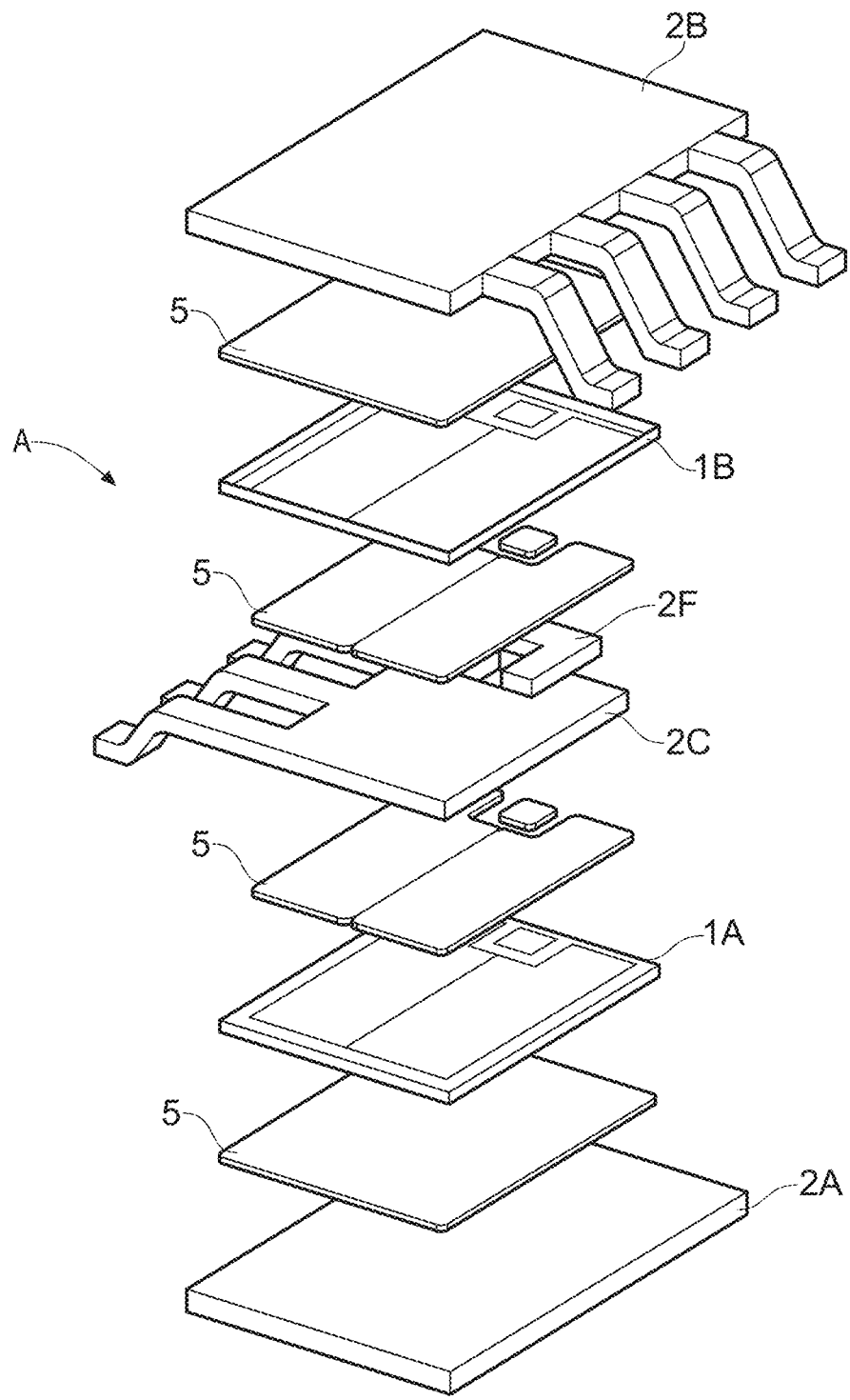
FIG. 3A is an exploded view of part of a packaged semiconductor device according to another embodiment of the present disclosure.
Figure 3B:
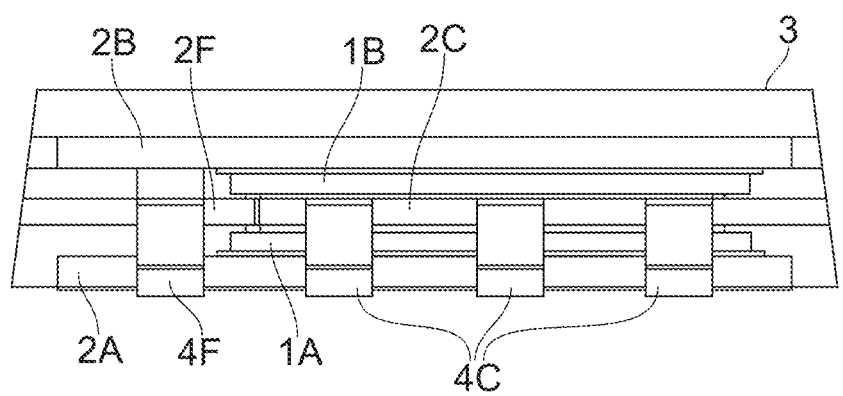
FIG. 3B is cross-sectional view of the packaged semiconductor device shown of FIG. 3A.

FIG. 3A shows an exploded view of part of a packaged semiconductor device 30 in accordance with another embodiment of the present disclosure. FIG. 3B shows a cross-sectional view of packaged semiconductor device 30 seen from the direction indicated by arrow A in FIG. 3A.

In this example, instead of having a common drain terminal for both the first and second electrical components, two terminals are provided on the first surface of each of first and second semiconductor dies 1A and 1B. More particularly, a first and third terminal are arranged at the first surface of semiconductor dies 1A and 1B, while a second terminal is arranged at a second surface of semiconductor dies 1A and 1B. For example, the first terminal may be a source or emitter terminal, the second terminal may be a drain or collector terminal, and the third terminal may be a gate or base terminal.

In the embodiment shown in FIGS. 3A and 3B, the first terminals of the first and second electrical component on semiconductor dies 1A and 1B, respectively, are electrically connected through third conductive element 2C, which also comprises a plurality of leads 4C extending through solidified moulding compound 3 for providing a contact point outside of solidified moulding compound 3 for the first terminals. The second terminal of the first electrical component on first semiconductor die 1A is electrically connected to first conductive element 2A, and the second terminal of the second electrical component on second semiconductor die 1B is electrically connected to a second conductive element 2B. In this example, first conductive element 2A does not comprise any leads. Instead, a bottom surface thereof serves as a contact region for the second terminal of first semiconductor die 1A. More in particular, first conductive element 2A is shaped as a die pad that is exposed to the outside, i.e. not covered by the solidified moulding compound.

Packaged semiconductor device 30 further comprises a sixth conductive element 2F that electrically connects the third terminal of the first and second electrical component on first and second semiconductor dies 1A and 1B, respectively, and that comprises a lead 2F that extends through solidified moulding compound 3 for providing an external contact point outside of solidified moulding compound 3 for the third terminal of both the first and second electrical component.

Additionally, as shown in FIG. 3A, each conductive element may be electrically connected to a respective surface of a respective semiconductor die through a respective conductive layer 5, for example comprising aluminium, copper, silver, gold, tin, or another conductive material.

The embodiment shown in FIGS. 3A and 3B may for example be referred to as a device with a common gate as well as a common source. However, other combinations of terminals are possible without deviating from the scope of the present disclosure. For example, a common-gate and common-drain, or a common-source and a common-drain combination can similarly be implemented.

A process of manufacturing packaged semiconductor device 30 is described next, with reference to FIG. 3A. As a first step, first conductive element 2A is provided. For example, first conductive element 2A is shaped as a die pad and is comprised in a lead frame comprising a plurality of said first conductive elements 2A for manufacturing a plurality of packaged semiconductor devices 30 simultaneously.

Next, first semiconductor die 1A is arranged on top of first conductive element 2A. Conductive layer 5, such as a solder layer, may be used to attach first semiconductor die 1A to first conductive element 2A and to electrically connect first conductive element 2A to a second terminal of the first electronic component integrated on first semiconductor die 1A.

Then, third and sixth conductive elements 2C and 2F are attached on top of first semiconductor die 1A, for example through conductive layer 5, thereby electrically connecting a first and third terminal of the first electronic component to third and sixth conductive elements 2C and 2F, respectively. For example, third and sixth conductive elements 2C and 2F may be comprised in a lead frame that is aligned with first semiconductor die 1A to properly attach the conductive elements. Third and sixth conductive elements 2C and 2F may be referred to as clips, having leads which will eventually extend externally to the package to enable an external connection to the first and third terminals. Alternatively, the aforementioned clips are singulated prior to arranging them on first semiconductor die 1A.

Following this, second semiconductor die 1B is arranged on top of third and sixth conductive elements 2C and 2F and attached thereto through conductive layer 5, for example a solder layer. First and second semiconductor dies 1A and 1B may be identical to one another, or may have a similar configuration. In that case, second semiconductor die 1B is arranged on top of third and sixth conductive elements 2C and 2F in a 'flipped' manner, such that the first and third terminals of the first and second electrical component face each other. Consequently, the first and third terminals of the second electrical component are also electrically connected to third and sixth conductive elements 2C and 2F, respectively.

Next, second conductive element 2B is arranged on top of the second surface of second semiconductor die 1B, for example through a solder layer (i.e., conductive layer 5), such that second conductive element 2B is electrically connected to the second terminal of the second electrical component on second semiconductor device 1B. Second conductive element 2B may be referred to as a clip comprising one or more leads which will eventually extend externally to the package to enable an external connection to the first and third terminals.

A moulding process is then used to encapsulate at least a portion of the above-described structure, for example using a moulding compound 3. Solidified moulding compound 3 may be arranged such that the leads of each conductive element extend through the solidified moulding compound, while remaining components of packaged semiconductor device 30 are encapsulated by solidified moulding compound 3. Optionally, a portion of solidified moulding compound 3 is omitted, such that a portion of first and/or second conductive element 2A or 2B is exposed. In such configurations, said portion of first and/or second conductive element 2A or 2B may be attached to a heat sink or heat spreader, using thermal paste or the like, to remove heat from packaged semiconductor device 30 in operation.

Finally, the structure is singulated from the lead frame in which first conductive element 2A (e.g., a die pad) is comprised, to obtain packaged semiconductor device 30.

The above process may similarly apply to other embodiments of the present disclosure. For example, for packaged semiconductor devices 10 and 20, first, second, third, fourth and fifth conductive elements 2A-2E may be clips comprised in a lead frame which may or may not be singulated prior to arranging them. In addition, conductive layers 5, such as solder layers or layers of another type of conductive metal, may be used to attach and electrically connect the various components in said packaged devices. Consequently, it will be appreciated that the process of manufacturing packaged semiconductor devices 10 and 20 may be similar to that of packaged semiconductor device 30. A detailed description thereof is therefore omitted.

Figure 4A:
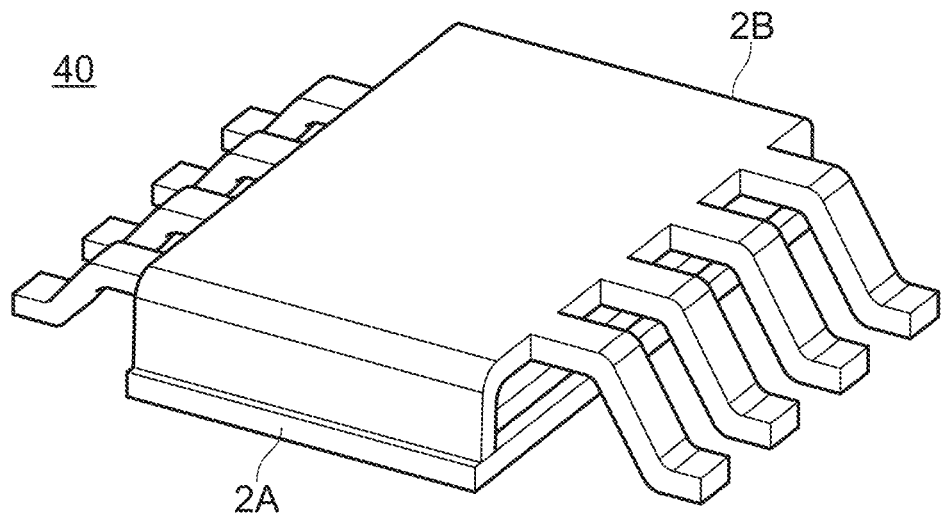
FIGS. 4A and 4B are perspective views of part of a packaged semiconductor device according to various embodiments of the present disclosure.
Figure 4B:
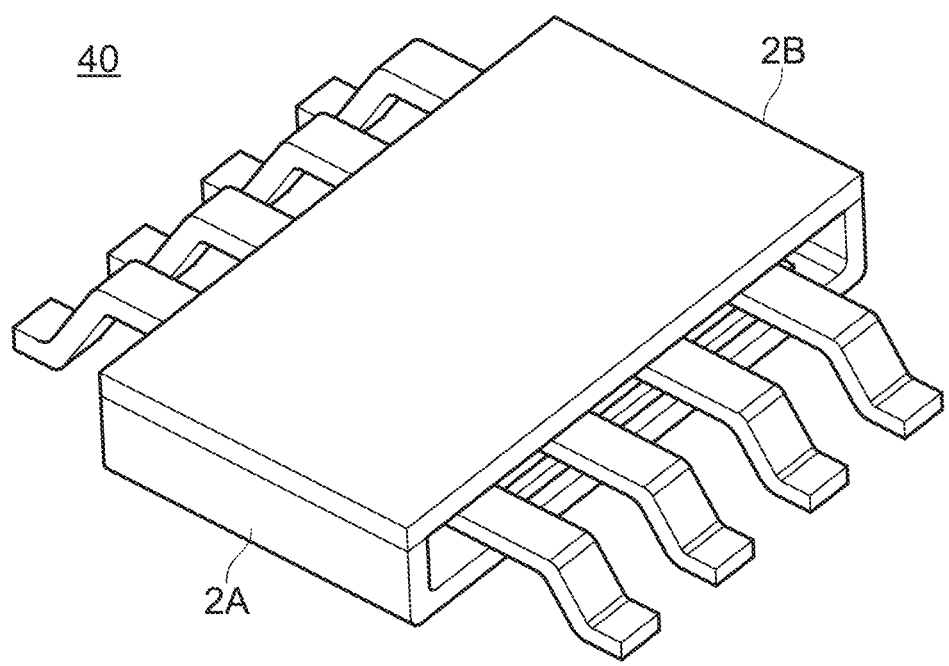

FIGS. 4A and 4B illustrate a packaged semiconductor device 40 according to another embodiment of the present disclosure. Compared to packaged semiconductor device 30, packaged semiconductor device 40 comprises an additional electrical connection between first and second conductive elements 2A and 2B, to thereby provide a common second terminal for both the first and second electrical component on semiconductor dies 1A and 1B, respectively. In other words, each of the first, second and third terminals of the first and second electrical components on semiconductor dies 1A and 1B is electrically connected to a corresponding combined conductive element such that all three terminals are shared. For example, if a MOSFET is implemented on first and second semiconductor dies 1A and 1B, then packaged semiconductor device 40 provides a common terminal for the drain terminal, the source terminal, and the gate terminal.

FIG. 4A is an example of how first and second conductive elements 2A and 2B can be electrically connected. In particular, in this embodiment, second conductive element 2B comprises bends at opposing ends thereof that extend towards first conductive element 2A and partially surrounds first and second semiconductor dies 1A and 1B. On the other hand, in FIG. 4B, first conductive element 2A comprises the bends that extend towards second conductive element 2B. The embodiments discussed above are in the art referred to as loss free packages, i.e. LFPAK, or small outline packages, SOT.

In the above, the present disclosure has been explained using detailed embodiments thereof. However, it should be appreciated that the disclosure is not limited to these embodiments and that various modifications are possible without deviating from the scope of the present disclosure as defined by the appended claims.

What is claimed is:

1. A packaged semiconductor device, comprising:
   a first semiconductor die on which a first electrical component is integrated that comprises a first terminal arranged at a first surface of the first semiconductor die and a second terminal arranged at a second surface of the first semiconductor die;
   a second semiconductor die on which a second electrical component is integrated that comprises a first terminal arranged at a first surface of the second semiconductor die and a second terminal arranged at a second surface of the second semiconductor die;
   wherein the first surface of the second semiconductor die is arranged to face the first surface of the first semiconductor die;
   a first conductive element arranged on the second surface of the first semiconductor die and being electrically connected to the second terminal of the first electrical component;
   a second conductive element arranged on the second surface of the second semiconductor die and being electrically connected to the second terminal of the second electrical component;
   a third conductive element arranged in between the first surfaces of the first semiconductor die and the second semiconductor die;
      wherein the first terminals of the first and second electrical components are electrically connected through the third conductive element; and
   a solidified moulding compound encapsulating the first semiconductor die and the second semiconductor die;
   wherein the second conductive element comprises one or more second leads that extend through and out of the solidified moulding compound to provide external electrical access to the second conductive element, wherein the second conductive element bends at opposing ends from the one or more second leads, wherein the second conductive element is attached to the first conductive element;
   wherein the third conductive element comprises one or more third leads that extend through and out of the solidified moulding compound to provide external electrical access to the third conductive element; and
   wherein the third conductive element is configured to provide a common first terminal for the first and second electrical components.

2. The packaged semiconductor device according to claim 1, wherein the first conductive element comprises a die pad; and/or
   wherein the first conductive element is partially encapsulated by the solidified moulding compound.

3. The packaged semiconductor device according to claim 1, wherein both the second conductive element and the third conductive element comprise leads.

4. The packaged semiconductor device according to claim 1, wherein the first and second electrical components each comprise a third terminal arranged at the second surface of the first semiconductor die and the second surface of the second semiconductor die, respectively;
   wherein the packaged semiconductor device further comprises a fourth conductive element electrically connected to the third terminal of the first electrical component; and
   a fifth conductive element electrically connected to the third terminal of the second electrical component;
   wherein the fourth conductive element comprises one or more fourth leads that extend through and out of the solidified moulding compound to provide external electrical access to the fourth conductive element;
   wherein the fifth conductive element comprises one or more fifth leads that extend through and out of the solidified moulding compound to provide external electrical access to the fifth conductive element; and
   wherein the first and second electrical components are field-effect transistors, such as metal-oxide-semiconductor field-effect transistors, MOSFETs, and wherein the first terminal corresponds to a drain terminal, the second terminal to a source terminal, and the third terminal to a gate terminal.

5. The packaged semiconductor device according to claim 4, wherein the first semiconductor die and the second semiconductor die are identical;
   wherein the packaged semiconductor device further comprises a conductive layer arranged in between each of the first, second and third conductive elements and the first, second and third terminals, that it is connected to;
   wherein each conductive layer comprises one element selected from the group consisting of copper, aluminium, silver, gold, and tin; and/or
   wherein each of the first, second and third conductive elements, comprises a central planar part that is connected to a corresponding terminal and from which the one or more leads extend.

6. The packaged semiconductor device according to claim 5, wherein the first or second conductive element comprises a bent edge part integrally connected to the central part, the bent edge part being electrically connected to the central part of the second or first conductive element, respectively; and
   wherein the fourth or fifth conductive element comprises a bent edge part integrally connected to the central part, the bent edge part being electrically connected to the central part of the fifth or fourth element, respectively.

7. The packaged semiconductor device according to claim 4, wherein the second conductive element is electrically connected to the first conductive element, thereby providing a common second terminal for the first and second electrical components, and/or
wherein the fourth conductive element is electrically connected to the fifth conductive element, thereby providing a common third terminal for the first and second electrical components.

8. The packaged semiconductor device according to claim 4, wherein the second conductive element and the fifth conductive element extend parallel to each other;
wherein the second conductive element and the fifth conductive element formed different parts of a same clip comprised by a lead frame; and/or
wherein the first conductive element and the fourth conductive element formed different parts of a same clip comprised by a lead frame.

9. The packaged semiconductor device according to claim 1, wherein the first and second electrical components each comprise a third terminal arranged at the second surface of the first semiconductor die and the second surface of the second semiconductor die, respectively;
wherein the packaged semiconductor device further comprises a fourth conductive element electrically connected to the third terminal of the first electrical component; and
a fifth conductive element electrically connected to the third terminal of the second electrical component;
wherein the fourth conductive element comprises one or more fourth leads that extend through and out of the solidified moulding compound to provide external electrical access to the fourth conductive element;
wherein the fifth conductive element comprises one or more fifth leads that extend through and out of the solidified moulding compound to provide external electrical access to the fifth conductive element;
wherein the first and second electrical components are bipolar transistors; and
wherein the first terminal corresponds to a collector terminal, the second terminal to an emitter terminal, and the third terminal to a base terminal.

10. The packaged semiconductor device according to claim 1, wherein the first and second electrical components each comprise a third terminal arranged at the first surface of the first semiconductor die and the first surface of the second semiconductor die, respectively;
the packaged semiconductor device further comprising a sixth conductive element arranged in between the first surfaces of the first semiconductor die and the second semiconductor die, wherein the third terminals of the first and second electrical components are electrically connected through the sixth conductive element, and wherein the sixth conductive element is configured to provide a common third terminal for the first and second semiconductor dies;
wherein the sixth conductive element comprises one or more sixth leads that extend through and out of the solidified moulding compound to provide external electrical access to the sixth conductive element;
wherein the third conductive element comprises one or more of the third leads;
wherein the first and second electrical components are field-effect transistors, such as metal-oxide-semiconductor field-effect transistors, and MOSFETs; and
wherein the first terminal corresponds to a source terminal, the second terminal to a drain terminal, and the third terminal to a gate terminal.

11. The packaged semiconductor device according to claim 10, wherein the first conductive element comprises a die-pad.

12. The packaged semiconductor device according to claim 11, wherein the first conductive element is at least partially exposed to an outside for allowing electrical connection to the first conductive element; and/or
wherein the second conductive element is at least partially exposed to the outside for allowing a heat sink or heat spreader to be connected to the second conductive element.

13. The packaged semiconductor device according to claim 10, wherein for at least one conductive element among the first to sixth conductive elements the one or more leads are gull-wing shaped.

14. The packaged semiconductor device according to claim 10, wherein the second conductive element is electrically connected to the first conductive element, thereby providing a common second terminal for the first and second semiconductor dies.

15. The packaged semiconductor device according to claim 14, wherein the first conductive element is at least partially exposed to an outside for allowing electrical connection to the first conductive element, and/or
wherein the second conductive element is at least partially exposed to the outside for allowing a heat sink or heat spreader to be connected to the second conductive element.

16. The packaged semiconductor device according to claim 10, wherein the sixth conductive element and the third conductive element extend parallel to each other; and
wherein the sixth conductive element and the third conductive element formed different parts of a same clip comprised by a lead frame.

17. The packaged semiconductor device according to claim 10, wherein the first semiconductor die and the second semiconductor die are identical;
wherein the packaged semiconductor device further comprises a conductive layer arranged in between each of the first, second, third, fourth, fifth and sixth conductive elements and the first, second and third terminals, that it is connected to; wherein each conductive layer comprises one element selected from the group consisting of copper, aluminium, silver, gold, and tin; and
wherein each of the first, second, third, fourth, fifth and sixth conductive elements, comprises a central planar part that is connected to a corresponding terminal and from which the one or more leads extend.

18. The packaged semiconductor device according to claim 1, wherein the first and second electrical components each comprise a third terminal arranged at the first surface of the first semiconductor die and the first surface of the second semiconductor die, respectively;
wherein the packaged semiconductor device further comprising a sixth conductive element arranged in between the first surfaces of the first semiconductor die and the second semiconductor die, wherein the third terminals of the first and second electrical components are electrically connected through the sixth conductive element; and
wherein the sixth conductive element is configured to provide a common third terminal for the first and second semiconductor dies;
wherein the sixth conductive element comprises one or more sixth leads that extend through and out of the solidified moulding compound to provide external electrical access to the sixth conductive element;

wherein the third conductive element comprises one or more of the third leads, wherein the first and second electrical components are bipolar junction transistors (BJTs); and wherein the first terminal corresponds to an emitter terminal, the second terminal to a collector terminal, and the third terminal to a base terminal.

\* \* \* \* \*